(12) United States Patent
Lee et al.

(10) Patent No.: US 8,269,228 B2
(45) Date of Patent: *Sep. 18, 2012

(54) AC LIGHT EMITTING DIODE

(75) Inventors: Chung Hoon Lee, Ansan-si (KR); Ki Bum Nam, Ansan-si (KR); Dae Won Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 138 days.

This patent is subject to a terminal disclaimer.

(21) Appl. No.: 12/178,764

(22) Filed: Jul. 24, 2008

(65) Prior Publication Data

US 2009/0085048 A1  Apr. 2, 2009

(30) Foreign Application Priority Data

Sep. 27, 2007  (KR) .................. 10-2007-0097330

(51) Int. Cl.
*H01L 29/18* (2006.01)
(52) U.S. Cl. .................. 257/88; 257/E33.003
(58) Field of Classification Search .......... 257/88, 257/E33.003
See application file for complete search history.

(56) References Cited

U.S. PATENT DOCUMENTS

| 6,547,249 B2 * | 4/2003 | Collins et al. ............... 257/88 |
| 7,034,340 B2 * | 4/2006 | Yukimoto ................... 257/88 |
| 7,186,302 B2 * | 3/2007 | Chakraborty et al. ......... 148/33 |
| 7,417,259 B2 * | 8/2008 | Sakai et al. ................. 257/88 |
| 7,474,681 B2 * | 1/2009 | Lin et al. ................ 372/43.01 |
| 7,544,524 B2 * | 6/2009 | Lin et al. .................... 438/22 |
| 7,732,825 B2 * | 6/2010 | Kim et al. ................... 257/88 |
| 7,768,020 B2 * | 8/2010 | Kim et al. ................... 257/88 |
| 2002/0084467 A1 | 7/2002 | Krames et al. |
| 2004/0075399 A1 * | 4/2004 | Hall ......................... 315/291 |
| 2005/0024587 A1 * | 2/2005 | Somani ..................... 351/214 |
| 2005/0253151 A1 * | 11/2005 | Sakai et al. .................. 257/79 |
| 2006/0261361 A1 * | 11/2006 | Shakuda ..................... 257/98 |
| 2007/0114563 A1 * | 5/2007 | Paek et al. .................. 257/103 |
| 2007/0254459 A1 * | 11/2007 | Lee et al. .................... 438/483 |
| 2007/0284598 A1 * | 12/2007 | Shakuda et al. .............. 257/93 |

(Continued)

FOREIGN PATENT DOCUMENTS

EP   1 553 641   7/2005

(Continued)

OTHER PUBLICATIONS

Craven et al., "Structural Characterization of nonpolar (1120) a-plane GaN thin films grown on (1102) r-plane sapphire", Applied Physics Letter, vol. 81, No. 3, Jul. 15, 2002, pp. 469-471.*

(Continued)

*Primary Examiner* — Matthew Landau
*Assistant Examiner* — Joseph C Nicely
(74) *Attorney, Agent, or Firm* — H.C. Park & Associates, PLC

(57) ABSTRACT

Disclosed is a light emitting diode (LED) operated by being directly connected to an AC power source. An AC LED according to the present invention comprises a plurality of light emitting cells two-dimensionally arranged on a single substrate; and wires electrically connecting the light emitting cells; wherein the light emitting cells are connected in series by the wires to form a serial array, the single substrate is a non-polar substrate, and the light emitting cells have non-polar GaN-based semiconductor layers grown on the non-polar substrate.

15 Claims, 3 Drawing Sheets

U.S. PATENT DOCUMENTS

| | | | |
|---|---|---|---|
| 2008/0083929 A1* | 4/2008 | Fan et al. | 257/79 |
| 2008/0164485 A1* | 7/2008 | Lee | 257/93 |
| 2008/0179602 A1* | 7/2008 | Negley et al. | 257/88 |
| 2008/0179604 A1* | 7/2008 | Wang et al. | 257/91 |
| 2008/0203431 A1* | 8/2008 | Garcia et al. | 257/192 |
| 2008/0237613 A1* | 10/2008 | Lee et al. | 257/88 |
| 2009/0134413 A1* | 5/2009 | Roth et al. | 257/98 |
| 2009/0242935 A1* | 10/2009 | Fitzgerald | 257/187 |
| 2009/0267085 A1* | 10/2009 | Lee et al. | 257/88 |
| 2009/0272991 A1* | 11/2009 | Lee et al. | 257/91 |
| 2009/0316260 A1* | 12/2009 | Howes | 359/443 |
| 2010/0006867 A1* | 1/2010 | Lee et al. | 257/88 |
| 2010/0019253 A1* | 1/2010 | Kim et al. | 257/88 |
| 2010/0033561 A1* | 2/2010 | Hersee | 348/80 |
| 2010/0059763 A1* | 3/2010 | Kim et al. | 257/77 |
| 2010/0072905 A1* | 3/2010 | Kim et al. | 315/192 |
| 2010/0096648 A1* | 4/2010 | Lee | 257/91 |
| 2010/0117056 A1* | 5/2010 | Nagai | 257/13 |
| 2010/0117101 A1* | 5/2010 | Kim et al. | 257/88 |
| 2010/0117188 A1* | 5/2010 | Waldrab et al. | 257/506 |
| 2010/0176405 A1* | 7/2010 | Villard | 257/88 |

FOREIGN PATENT DOCUMENTS

| | | |
|---|---|---|
| KR | 10-2006-0117210 | 11/2006 |
| KR | 10-2007-0013320 | 1/2007 |
| WO | 2006/137711 | 12/2006 |
| WO | WO 2007018360 A1 * | 2/2007 |
| WO | 2007/055468 | 5/2007 |
| WO | WO 2007055468 A1 * | 5/2007 |
| WO | WO 2007081092 A1 * | 7/2007 |

OTHER PUBLICATIONS

"Nonpolar InGaN/GaN emitters on reduced-defect lateral epitaxially overgrown a-plane GaN with drive-current independent electroluminescence emission peak", Applied Physics Letters, vol. 85, No. 22, Nov. 29, 2004, by Chakraborty, et al., pp. 5143-5145.

"Prospective emission efficiency and in-plane light polarization of nonpolar m-plane $In_xGa_{1-x}N$/GaN blue light emitting diodes fabricated on freestanding GaN substrates", Applied Physics Letters vol. 89(9), Aug. 28, 2006, by Koyama, et al., pp. 091906-1 through 091906-3.

"Radiative and nonradiative lifetimes in nonpolar m-plane $In_xGa_{1-x}N$/ GaN multiple quantum wells grown on GaN templates prepared by lateral epitaxial overgrowth", J. Vac. Sci. Technol. vol. 25(4), Jul. 31, 2007, by Onuma, et al., pp. 1524-1528.

Extended European Search Report dated Apr. 13, 2010 for Application No. EP 08 01 2492.

* cited by examiner

AC LIGHT EMITTING DIODE

CROSS REFERENCE TO RELATED APPLICATIONS

This application claims priority from and the benefit of Korean Patent Application No. 10-2007-0097330, filed on Sep. 27, 2007, which is hereby incorporated by reference for all purposes as if fully set forth herein.

BACKGROUND OF THE INVENTION

1. Field of the Invention

The present invention relates to a light emitting diode operated by being directly connected to an AC power source, and more particularly, to an AC light emitting diode having improved performance such as quantum efficiency.

2. Description of the Related Art

A light emitting diode (LED), which is a photoelectric conversion device having a structure in which an N-type semiconductor and a P-type semiconductor are joined together, emits predetermined light through recombination of the electrons and holes. Such an LED is widely used for display elements and backlights. Further, LEDs have less electric power consumption and a longer lifespan as compared with conventional light bulbs or fluorescent lamps, so that their application areas have been expanded to the use thereof for general illumination while substituting for conventional incandescent bulbs and fluorescent lamps.

An LED is repeatedly turned on/off depending on the direction of current under an AC power source. Therefore, when the LED is directly connected to an AC power source, the LED may not continuously emit light and may be easily damaged due to reverse current. Also, the LED cannot be used to be directly connected to a general AC power source.

In order to solve such a problem, there may be used a method of operating an LED by disposing a rectifier between the LED and an AC power source and rectifying AC to DC. However, the necessity of such a rectifier makes it difficult to substitute LEDs for illuminators such as fluorescent lamps. Alternatively, there may be used a method of connecting a plurality of LEDs in reverse parallel with one another to be directly connected to a high-voltage AC power source. However, there are problems in that since a large number of LEDs should be connected to be operated, the entire size of a light emitting apparatus may be large and the number of processes such as wire connection may be increased as the respective LEDs are connected to one another.

SUMMARY OF THE INVENTION

Accordingly, an AC LED which can be operated at a single chip level by being connected to an AC power source has been proposed. The conventional AC LED has a structure in which a plurality of light emitting cells are two-dimensionally arranged on a single substrate. Each of the light emitting cells has GaN-based semiconductor layers grown on the single substrate.

The conventional AC LED may have a small area of a light emitting region as compared with a DC LED in which an entire plane region on a substrate substantially becomes a light emitting region. This is because light is restrictively emitted by only the light emitting cells arranged on the single substrate. Therefore, a light emitting amount is decreased under the predetermined area of a LED chip.

Accordingly, the present inventors have proposed a technique for compensating for a light emitting amount decreased by the reduction of a light emitting region by enhancing quantum efficiency (particularly, internal quantum efficiency) in an AC LED in which the area of the light emitting region is relatively reduced due to employment of the light emitting cells.

In fabricating an AC LED, processes of sequentially growing GaN-based semiconductor layers on a single substrate and then removing the GaN-based semiconductor layers except regions to be light emitting cells to a thickness to expose the substrate are used to form the plurality of light emitting cells. At this time, a c-plane {0001} substrate, particularly a c-plane sapphire substrate is used as a single substrate on which GaN-based semiconductor layers are grown.

GaN and its compounds are the most stable in a hexagonal system crystal structure expressed by axes of equivalent bases, which rotate at an angle of 120 degrees with respect to each other and are all perpendicular to the unique c-axis as shown in FIG. 5. Referring to FIG. 5, as a result of positions of gallium and nitrogen atoms in the crystal structure, each plane contains only one kind of atom, i.e., Ga or N while advancing along the c-axis plane by plane. In order to maintain charge neutrality, GaN crystals form the boundary between one c-plane containing only nitrogen atoms and one c-plane containing only gallium atoms. As a result, the GaN crystals are polarized along the c-axis, and the voluntary polarization of the GaN crystals depends on the crystal structure and composition as bulk properties.

Since it is relatively easy to grow c-plane {0001} containing Ga atoms, almost all conventional GaN-based LEDs are grown in parallel with a polar c-axis. In addition, interface stress between different kinds of layers may additionally cause piezoelectric polarization. At this time, the total polarization is the sum of voluntary polarization and piezoelectric polarization.

As described above, the conventional AC LED comprises light emitting cells consisting of GaN-based semiconductor layers grown along a c-axis direction. In such an AC LED, due to strong piezoelectric polarization and voluntary polarization, c-plane quantum well structures of the LED are influenced by a quantum-confined stark effect (QCSE) in an active region. Further, electrons and holes are spatially separated by strong internal electric fields along the c-direction, so that recombination efficiency of electrons and holes is considerably deteriorated.

Therefore, an object of the present invention is to provide an AC LED, wherein a non-polar substrate is used instead of a polar substrate, which has been used as a single substrate of a conventional AC LED, whereby the quantum efficiency is enhanced, and therefore, the luminous efficiency of the AC LED having a small light emitting region per chip is increased.

Another object of the present invention is to provide an AC LED, in which light emitting cells are arranged to secure excellent operation properties and optical power at a chip level having a limited size.

A further object of the present invention is to provide an AC LED capable of preventing a transient voltage from being applied to a specific light emitting cell when the AC LED operates.

According to the present invention for achieving these objects, there is provided an AC LED. The AC LED according to embodiments of the present invention comprises a plurality of light emitting cells two-dimensionally arranged on a single substrate. In addition, the light emitting cells are electrically connected by wires. A serial array of the light emitting cells is formed by the wires.

At this time, the single substrate is a non-polar substrate, and the light emitting cells have non-polar GaN-based semiconductor layers grown on the non-polar substrate. According to an embodiment of the present invention, the GaN-based semiconductor layers may be a-plane GaN-based semiconductor layers grown using an r-plane sapphire substrate or a-GaN substrate as the non-polar substrate. According to another embodiment of the present invention, the GaN-based semiconductor layers may be m-plane GaN-based semiconductor layers grown using an m-plane sapphire substrate or m-GaN substrate as the non-polar substrate.

In this specification, the term "non-polar substrate" or "substrate" having the meaning similar thereto is defined as a substrate having an r-, m- or a-plane on which a non-polar a- or m-plane GaN-based compound is grown.

The serial array is operated by being connected to an AC power source. At this time, the serial array may comprise first and second serial arrays, and the first and second serial arrays are connected in reverse parallel to be operated by AC power. A bridge rectifier may be formed by connecting some of the light emitting cells formed on the single substrate through wires. The serial array of the light emitting cells is electrically connected to the bridge rectifier, thereby being operated by the AC power source. Accordingly, there is provided an AC LED capable of being operated by being connected to an AC power source.

Meanwhile, the light emitting cells are laterally and longitudinally spaced apart from one another at distances, each of which is ranged from 10 to 30 μm, respectively. When the light emitting cells are spaced apart from one another by a distance of 10 μm or less, the distance between the light emitting cells becomes narrow. For this reason, contaminants such as particles remain between the light emitting cells, and therefore, current leakage may occur between the light emitting cells. Further, it is difficult to perform an etching process for electrically isolating the light emitting cells from one another and a process of forming wires. In addition, short circuits between the wires may occur. When the light emitting cells are spaced apart from one another by a distance of 30 μm or more, a turned-on voltage and operation voltage of the serial array of the light emitting cells is increased, and operation time of the light emitting cells is shortened accordingly. That is, when the LED is operated under AC power, a voltage applied to the array of the light emitting cells depending on the phase of AC power is changed in the form of a sine wave. At this time, if the turned-on voltage and operation voltage of the serial array of the light emitting cells is large, the light emitting cells are turned on and operated when the applied voltage is considerably increased. In a state where the applied voltage is small, the light emitting cells are not operated. Therefore, when the turned-on voltage and operation voltage are large, the operation time of the light emitting cells is decreased. As a result, the amount of light emitted from the LED is decreased, and the time when the LED is turned off is increase, causing a flickering phenomenon that light is flickeringly emitted. In addition, a time for etching the semiconductor layers should be increased in order for the light emitting cells to be spaced apart from one another by a distance of 30 μm or more, an therefore, the light emitting cells may be easily damaged due to the etching for a long period of time.

The distances between the light emitting cells in the lateral direction may substantially have the same value, but without being limited thereto, may have different values within the aforementioned range. Further, the distances between the light emitting cells in the longitudinal direction may substantially have the same value, but without being limited thereto, may have different values within the aforementioned range.

Meanwhile, each of the light emitting cells comprise a non-polar first conductive type semiconductor layer formed on the non-polar substrate, a non-polar second conductive type semiconductor layer formed on top of one region of the first conductive type semiconductor layer, and a non-polar active layer interposed between the first and second conductive type semiconductor layers. The first conductive type semiconductor layer, the active layer and the second conductive type semiconductor layer may be formed of a III-V compound semiconductor, particularly (Al, In, Ga)N. Each of the wires electrically connects the first conductive type semiconductor layer of one of the light emitting cells to the second conductive type semiconductor layer of adjacent another of the light emitting cells, thereby forming the serial array of the light emitting cells.

In addition, at least one shunt wire electrically connects corresponding wires in the first and second serial arrays connected in reverse parallel to each other. The shunt wire prevents an overvoltage from being applied to a specific light emitting cell in the serial array to which a reverse voltage is applied when the AC LED is operated.

The at least shunt wire may be formed together with the wires using the same material as the wires. Further, the at least shunt wire may be disposed between the light emitting cells.

A transparent electrode layer may be formed on the second conductive type semiconductor layer of each of the light emitting cells. The transparent electrode layer allows current in the second conductive type semiconductor layer to be uniformly spread, and allows light generated from the active layer to be emitted upward from the second conductive type semiconductor layer.

Meanwhile, a reflection layer may be formed on the second conductive type semiconductor layer of each of the light emitting cells. Also, the light emitting cells may be flip-bonded on a submount substrate through metal bumps. The reflection layer is employed to reflect light that is generated from the active layer and directed to the submount substrate.

In order to bond the metal bumps on the submount substrate, bonding patterns may be formed on the submount substrate. The wire may also be formed using the bonding patterns formed on the submount substrate.

DETAILED DESCRIPTION OF THE INVENTION

Figure 1:
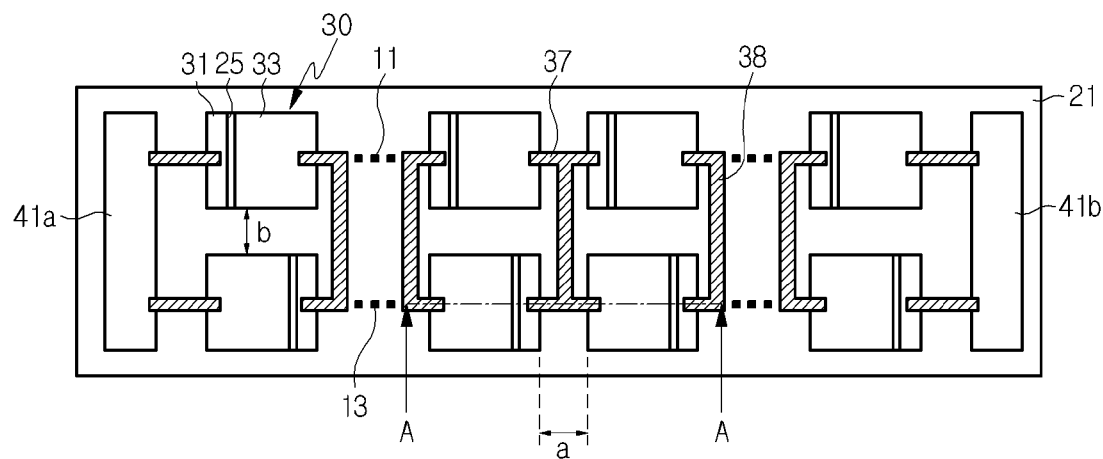
FIG. 1 is a plan view illustrating an AC LED according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
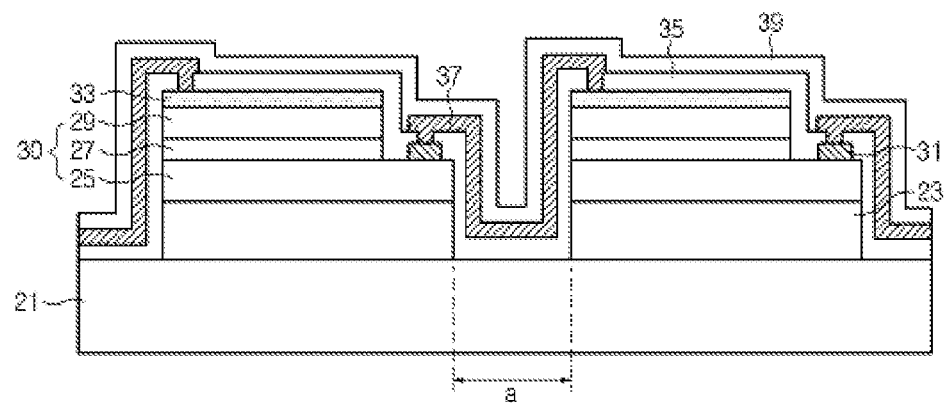
FIG. 2 is a sectional view taken along line A-A of FIG. 1.

FIG. 1 is a plan view illustrating an AC LED according to an embodiment of the present invention, and FIG. 2 is a sectional view taken along line A-A of FIG. 1.

Referring to FIGS. 1 and 2, a plurality of light emitting cells 30 are arranged on a substrate 21. Generally, the substrate 21 has a limited size, for example, a size of 2000×2000 µm² or less. The size of the substrate 21 means the size of a single chip, such a single chip is standardized within the aforementioned size.

Each of the light emitting cells 30 comprises a first conductive type semiconductor layer 25, a second conductive type semiconductor layer 29 positioned on one region of the first conductive type semiconductor layer 25, and an active layer 27 interposed between the first and second conductive type semiconductor layers 25 and 29. The first and second conductive type semiconductor layers 25 and 29 and the active layer 27 may be formed of a III-V compound semiconductor, particularly (Al, In, Ga)N. At this time, the light emitting cells 30 are laterally and longitudinally spaced apart from one another at distances "a" and "b", each of which is ranged from 10 to 30 µm, respectively. Here, the spacing distances "a" between the light emitting cells in the lateral direction may substantially have the same value, but without being limited thereto, may have different values. Further, the spacing distances "b" between the light emitting cells 30 in the longitudinal direction may substantially have the same value, but without being limited thereto, may have different values.

Figure 5:
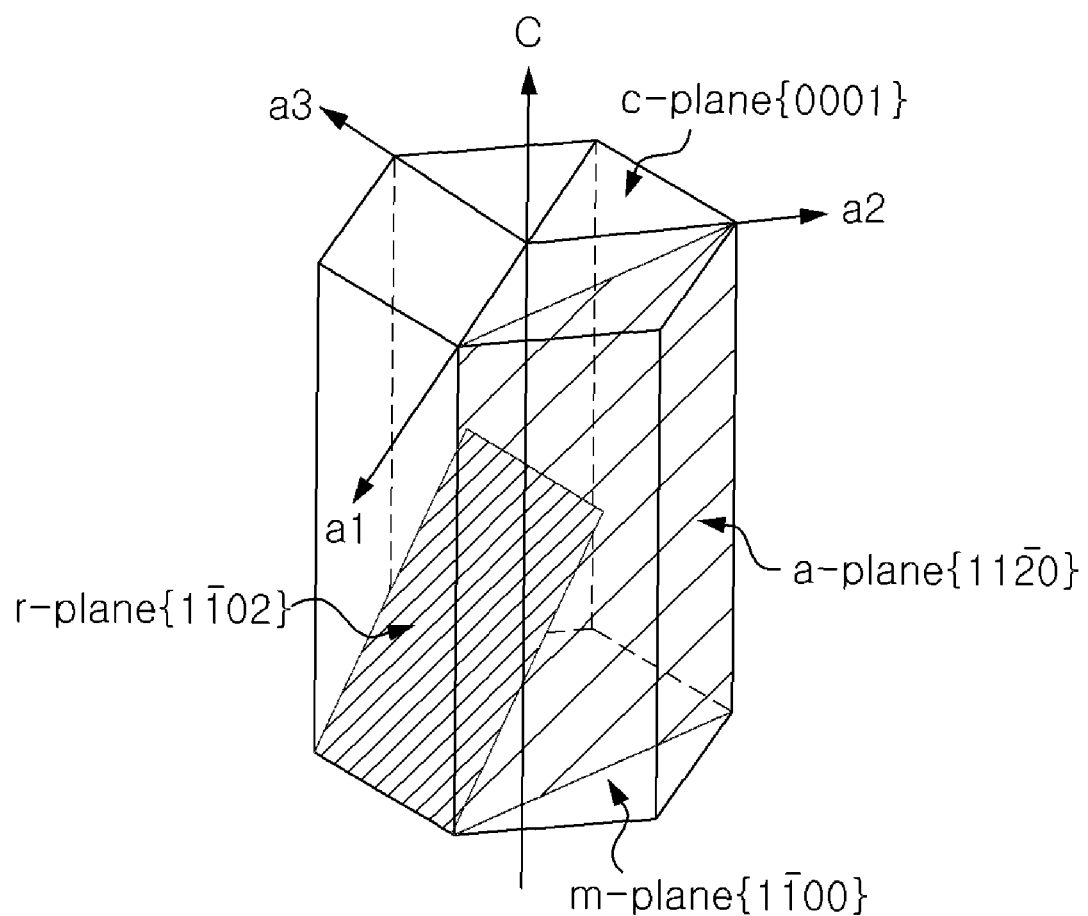
FIG. 5 is a view of a hexagonal system structure illustrating a growth surface and growth direction of a GaN-based semiconductor layer.

According to the present invention, the substrate 21 is a non-polar substrate, and in this embodiment, an r-plane {1$\bar{1}$02} (see FIG. 5) sapphire substrate is used as the substrate 21. GaN-based semiconductor layers including the first conductive type semiconductor layer 25, the second conductive type semiconductor layer 29 and the active layer 27 are grown on the r-plane sapphire substrate, thereby forming non-polar GaN-based semiconductor layers, particularly a-plane {1$\bar{1}$20} (see FIG. 5) GaN-based semiconductor layers.

Instead of the r-plane sapphire substrate, an a-GaN substrate having the a-plane {1$\bar{1}$20} as a growth plane may be used as the substrate. At this time, the a-GaN substrate may be grown on the r-plane sapphire substrate.

Instead of the r-plane sapphire substrate or a-GaN substrate, an m-plane {1$\bar{1}$00} (see FIG. 5) sapphire substrate or m-GaN substrate may also be used as the non-polar substrate. The non-polar GaN-based semiconductor layers grown on such a non-polar substrate become m-plane GaN-based semiconductor layers. For example, a method for growing non-polar GaN-based semiconductor layers on an r-plane or m-plane sapphire substrate or an a-GaN or m-GaN substrate preferably include hydride vapor phase epitaxy (HVPE), metal organic chemical vapor deposition (MOCVD), molecular beam epitaxy (MBE), liquid phase epitaxy (LPE), plasma-enhanced chemical vapor deposition (PECVD), and the like.

Since heterointerfaces are parallel with a polar c-axis, the non-polar GaN-based semiconductor layers obtained as described above remove an electromagnetic field induced by polarization that reduces the recombination rate of electrons and holes in an active region, so that recombination efficiency of electrons and holes in the active layer 27 are improved, thereby enhancing quantum efficiency.

The light emitting cells 30 are electrically connected to one another by wires 37. Each wire 37 connects the first conductive type semiconductor layer 25 of one light emitting cell 30 to the second conductive type semiconductor layer 29 of an adjacent light emitting cell 30. At this time, a first electrode pad 31 is formed on the first conductive type semiconductor layer 25, and a transparent electrode layer 33 is formed on the second conductive type semiconductor layer 29. The transparent electrode layer 33 may be formed of a material such as indium tin oxide (ITO) or Ni/Au. Generally, when the second conductive type semiconductor layer 29 is formed of a P-type semiconductor with large resistance, the transparent electrode layer 33 allows current to be uniformly spread in the second conductive type semiconductor layer 29. Since the transparent electrode layer 33 has transmittance with respect to light generated in the active layer 27, the light can be emitted upward from the second conductive type semiconductor layer 29.

As shown in these figures, each wire 37 connects the first electrode pad 31 and transparent electrode layer 33 of adjacent two of the light emitting cells to each other, so that the first and second conductive type semiconductor layers 25 and 29 of adjacent two of the light emitting cells 30 are electrically connected to each other. A second electrode pad (not shown) may be further formed on the transparent electrode layer 33, and the wire 37 may be connected to the transparent electrode layer 33 through the second electrode pad. An insulating layer 35 is interposed between the light emitting cells 30 and the wires 37 so that the first and second conductive type semiconductor layers 25 and 29 in the light emitting cells 30 can be prevented from being short-circuited by the wires 37. The insulating layer 35 may be formed by depositing a silicon oxide layer SiO$_2$ or a silicon nitride layer Si$_3$N$_4$ on top of the entire surface of the substrate 21 having the light emitting cells 30, the transparent electrode layers 33, the first electrode pads 31 and the like formed thereon. The insulating layer 35 is patterned to expose the transparent electrodes 33 and the first electrode pads 31. Each of the wires 37 is formed on the insulating layer 35 to connect the exposed transparent electrode layer 33 and the first electrode pad 31.

First and second serial arrays 11 and 13 having the light emitting cells 30 connected in series are formed by the wires 37. When the AC LED is operated, the first and second serial arrays 11 and 13 that are connected in reverse parallel are operated by an AC power source (not shown). Thus, in the LED, the first and second serial arrays 11 and 13 are alternately operated depending on the phase of AC power, so that light is continuously emitted.

Meanwhile, at least one shunt wire 38 electrically connects corresponding light emitting cells in the first and second serial arrays 11 and 13. The shunt wire 38 allows the corresponding light emitting cells in the first and second serial arrays 11 and 13 to have the same electric potential. Accordingly, when the serial arrays 11 and 13 connected in reverse parallel under AC power are operated, the light emitting cells are protected by preventing overvoltage from being applied to a specific light emitting cell in the serial array to which a reverse voltage is applied. The shunt wires 38 may electrically connect most of the light emitting cells so that all the corresponding light emitting cells in the first and second serial arrays 11 and 13 have the same electric potential. However, the present invention is not limited thereto, but some light emitting cells may be connected by the shunt wires.

The shunt wires 38 may be disposed between the light emitting cells 30. As shown in the figure, the shut wires 38 may connect corresponding wires 37 in the first and second serial arrays 11 and 13. The shunt wires 38 may be formed together with the wires 37 using the same material and process.

Meanwhile, in order to connect the LED to an AC power source, pads 41*a* and 41*b* are formed on the substrate 21, i.e., the non-polar substrate, and the first and second serial arrays 11 and 13 may be connected in reverse parallel to the pads 41*a* and 41*b*.

In addition, a protection layer 39 may be formed on top of the substrate 21 having the wires 37 in order to protect the wires 37 and the light emitting cells 30. The protection layer 39 may be formed of a silicon oxide layer $SiO_2$, a silicon nitride layer $Si_3N_4$, or the like.

In this embodiment, the light emitting cells are laterally and longitudinally spaced apart from one another at distances "a" and "b", each of which is ranged from 10 to 30 μm, respectively. If the light emitting cells are spaced apart from one another by a distance of 10 μm or less, it is difficult to perform an etching process for electrically isolating the light emitting cells from one another. In addition, contaminants such as particles remain between the light emitting cells, and therefore, current leakage may occur between the light emitting cells. Further, if the spacing distance between the light emitting cells is 10 μm or less, it is difficult to form the insulating layer 35 and the wires 37, and a short circuit may occur between the wires 37. Accordingly, the light emitting cells 30 are spaced apart from one another by a distance of 10 μm or more, so that the light emitting cells 30 can be easily formed using an etching technique, and the insulating layer 35, the wires 37 and the shunt wires 38 can be easily formed. In addition, it is possible to prevent leakage current between the light emitting cells. On the other hand, if the light emitting cells are spaced apart from one another by a distance of over 30 μm, the turned-on voltage of the serial array is excessively increased, and the operation time of the AC LED is decreased. Therefore, the amount of light emitted from the LED is decreased, and serious flickering may occur. In addition, while the light emitting cells 30 are formed by etching the semiconductor layers, etching time is excessively increased, so that the light emitting cells may be damaged due to the etching. Accordingly, the distance between the light emitting cells is limited to 30 μm or less, whereby it is possible to reduce the flickering of the AC LED and the damage to the light emitting cells by the etching.

It has been described in this embodiment that the first and second serial arrays 11 and 13 are operated in a state of being connected in reverse parallel. However, a single serial array with the light emitting cells connected in series may be formed on a single substrate. At this time, a bridge rectifier is formed on the substrate, and the serial array is connected to the bridge rectifier to be operated under AC power. The bridge rectifier may be formed by connecting the light emitting cells formed on the single substrate using wires.

Figure 3:
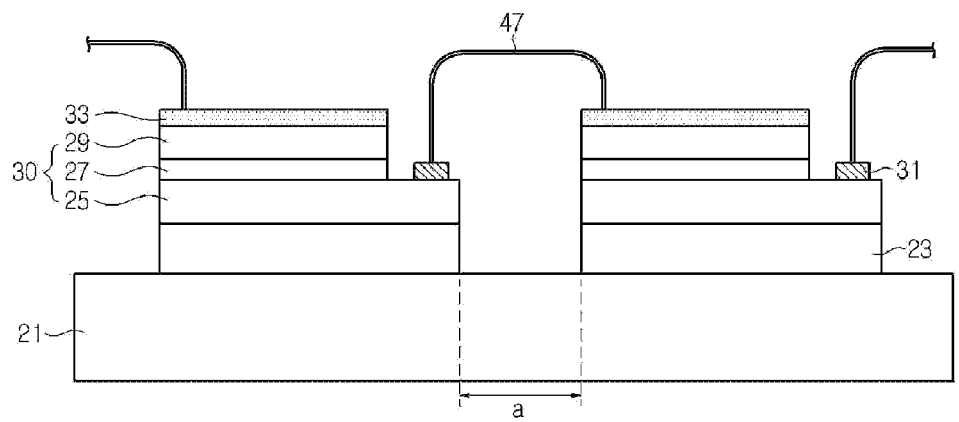
FIG. 3 is a sectional view illustrating an AC LED according to another embodiment of the present invention.

FIG. 3 is a sectional view illustrating an AC LED according to another embodiment of the present invention.

Referring to FIG. 3, a plurality of light emitting cells 30 having non-polar GaN-based semiconductor layers formed on a non-polar substrate 21 are two-dimensionally arranged as described with reference to FIGS. 1 and 2. A transparent electrode layer 33 may be formed on a second conductive type semiconductor layer 29 of the light emitting cells 30, and first electrode pads 31 may be formed on the first conductive type semiconductor layers 25. The light emitting cells 30 are electrically connected by wires 47 to form serial arrays. However, in this embodiment, the wires 47 connecting the light emitting cells 30 are formed by an air bridge process, unlike the wires 37 described with reference to FIG. 2. In each of the wires 47, a portion except its contacts is spaced apart from the substrate. Shunt wires (not shown) connecting corresponding light emitting cells 30 in the serial arrays may be formed together with the air bridge wires 47. Since the air bridge wires 47 are spaced apart from the light emitting cells 30, the insulating layer 35 for preventing the first and second conductive type semiconductor layers 25 and 29 of the light emitting cells 30 from being short-circuited by the wires 47 may be omitted.

In this embodiment, the light emitting cells are laterally and longitudinally spaced apart from one another by distances, each of which is ranged from 10 to 30 μm as described with reference to FIGS. 1 and 2.

Figure 4:
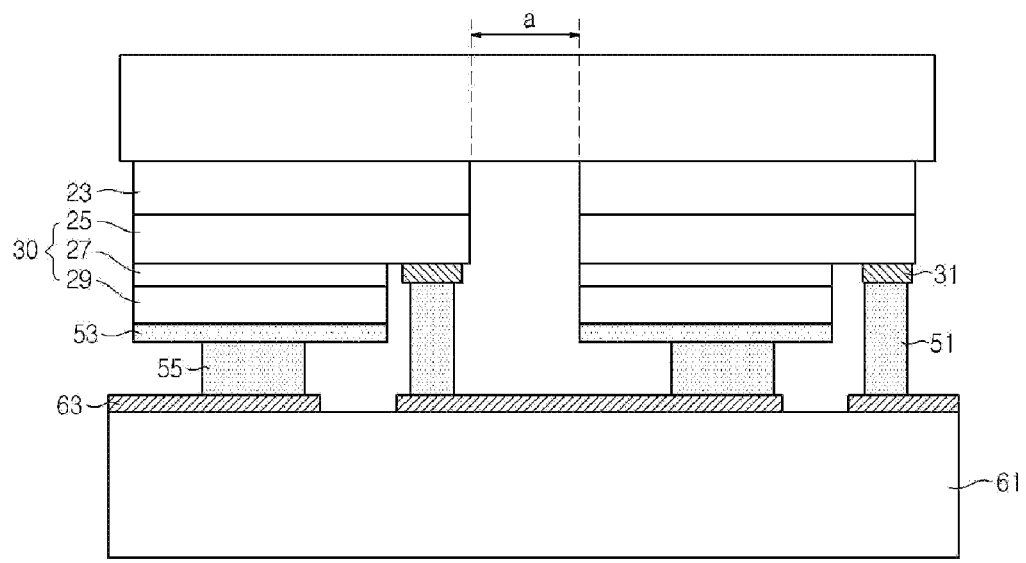
FIG. 4 is a sectional view illustrating an AC LED according to a further embodiment of the present invention.

FIG. 4 is a sectional view illustrating an AC LED according to a further embodiment of the present invention.

Referring to FIG. 4, a plurality of light emitting cells 30 having non-polar GaN-based semiconductor layers formed on a non-polar substrate 21 are two-dimensionally arranged as described with reference to FIG. 3. However, in this embodiment, metal bumps 51 and 55 are formed on top of first and second conductive type semiconductor layers 25 and 29, respectively, and the light emitting cells 30 are flip-bonded on a submount substrate 61 through the metal bumps 51 and 55. At this time, a reflection layer 53 is formed on the second conductive type semiconductor layer 29 to reflect light that is generated from an active layer 27 and directed to the submount substrate 61. First electrode pads 31 may be interposed between the metal bumps 51 and the first conductive type semiconductor layers 25.

Meanwhile, bonding patterns 63 for bonding the metal bumps 51 and 55 may be formed on the submount substrate 61. Pads (not shown) for electrically connecting the LED to an AC power source may also be formed on the submount substrate 61. As shown in this figure, the light emitting cells are flip-bonded so that the first conductive type semiconductor layer 25 of one light emitting cell 30 and the second conductive type semiconductor layer 29 of an adjacent light emitting cell 30 are electrically bonded to one bonding pattern 63. Therefore, the light emitting cells 30 can be connected in series to one another using the bonding patterns 63. That is, the bonding patterns 63 may serve as wires for connecting the light emitting cells 30. Accordingly, the light emitting cells 30 are connected by the bonding patterns 63, so that first and second serial arrays (11 and 13 of FIG. 1) can be formed.

In this embodiment, since the light emitting cells 30 are flip-bonded on the submount substrate 61, heat generated from the light emitting cells 30 during the operation can be dissipated through the submount substrate 61, thereby enhancing light emitting efficiency.

Meanwhile, it has been described in this embodiment that the light emitting cells 30 are connected in series to one another by the bonding patterns 63, but the present invention is not limited thereto. That is, the wires 37 (FIG. 2) or 47 (FIG. 3) for electrically connecting the light emitting cells 30 may be separately formed, and the light emitting cells 30 may be flip-bonded to corresponding bonding patterns 63 through the wires 37 or 47, respectively. In this case, the metal bumps 51 formed on the first conductive type semiconductor layer 25 may be omitted.

According to the present invention, a non-polar structure of GaN-based semiconductor layers constituting light emitting cells is employed, so that it is possible to improve the recombination efficiency of electrons and holes in an active region and accordingly to enhance the quantum efficiency. Therefore, it is possible to considerably improve a phenomenon that the amount of light emitted from an AC LED is decreased due to a small area of a light emitting region per chip.

According to the present invention, there is provided an AC LED which can be continuously operated by being connected to an AC power source. Further, the spacing distance between light emitting cells is set to be in a range of 10 to 30 μm, so that turned-on voltage and operation voltage can be lowered, thereby increasing light emitting time of the LED connected to the AC power source. Accordingly, the amount of light emitted from the LED can be increased, and flickering of the AC LED can be reduced. In addition, the light emitting cells are spaced apart from one another by a distance of 10 μm or more, so that wires for connecting the light emitting cells can be easily formed, and short circuits that occur between the wires can be prevented. Moreover, the light emitting cells are spaced apart from one another by a distance of 30 μm or less, so that it is possible to reduce etching time for forming the light emitting cells, and therefore, prevent the light emitting cells to be damaged by the etching.

The invention claimed is:

1. An AC light emitting diode (LED), comprising:
a plurality of light emitting cells two-dimensionally arranged on a single substrate;
wires electrically connecting the light emitting cells; and
an insulating layer arranged on the entirety of the light emitting cells and the substrate, wherein the insulating layer comprises $SiO_2$ or $Si_3N_4$, and the wires connect to the light emitting cells through holes in the insulating layer,
wherein the light emitting cells are connected in series by the wires to form a serial array, the single substrate comprises a non-polar substrate, and the light emitting cells comprise non-polar GaN-based semiconductor layers grown on the non-polar substrate,
wherein distances between the light emitting cells in a lateral direction have different values, and the distances are between 10 and 30 μm.

2. The AC LED as claimed in claim 1, wherein the GaN-based semiconductor layers are a-plane GaN-based semiconductor layers grown using an r-plane sapphire substrate or a-GaN substrate as the non-polar substrate.

3. The AC LED as claimed in claim 2, further comprising:
a second insulating layer arranged on the entirety of the light emitting cells and the substrate, wherein the second insulating layer comprises $SiO_2$ or $Si_3N_4$, and is arranged on top of the wires.

4. The AC LED as claimed in claim 1, wherein the GaN-based semiconductor layers are m-plane GaN-based semiconductor layers grown using an m-plane sapphire substrate or m-GaN substrate as the non-polar substrate.

5. The AC LED as claimed in claim 1, wherein the serial array is operated by being connected to an AC power source.

6. The AC LED as claimed in claim 1, wherein distances between the light emitting cells in a longitudinal direction have different values.

7. The AC LED as claimed in claim 6, wherein the distances are between 10 and 30 μm.

8. The AC LED as claimed in claim 1, wherein the serial array comprises first and second serial arrays, and the first and second serial arrays are connected in reverse parallel to be operated by AC power.

9. The AC LED as claimed in claim 8, further comprising at least one shunt wire electrically connecting corresponding wires in the first and second serial arrays connected in reverse parallel to each other,
the at least one shunt wire to prevent an overvoltage from being applied to a specific light emitting cell in the serial array to which a reverse voltage is applied when the AC LED is operated.

10. The AC LED as claimed in claim 9, wherein the at least one shunt wire connects the corresponding wires in the first and second serial arrays in a direction substantially perpendicular to the corresponding wires in the first and second serial arrays, and the entire at least one shunt wire is not arranged on any of the plurality of light emitting cells.

11. The AC LED as claimed in claim 9, wherein each light emitting cell comprises:
a non-polar first conductive type semiconductor layer formed on the non-polar substrate;
a non-polar second conductive type semiconductor layer formed on top of one region of the first conductive type semiconductor layer; and
a non-polar active layer interposed between the first conductive type semiconductor layer and the second conductive type semiconductor layer,
wherein each wire electrically connects the first conductive type semiconductor layer of one light emitting cell to the second conductive type semiconductor layer of an adjacent light emitting cell.

12. The AC LED as claimed in claim 11, wherein the at least one shunt wire is formed together with the wires using the same material as the wires.

13. The AC LED as claimed in claim 12, wherein the at least one shunt wire is disposed between the light emitting cells.

14. The AC LED as claimed in claim 11, further comprising a transparent electrode layer formed on the second conductive type semiconductor layer of each of the light emitting cells.

15. The AC LED as claimed in claim 1, further comprising a bridge rectifier formed on the substrate, wherein the bridge rectifier is formed by connecting the light emitting cells using the wires, and the serial array of the light emitting cells is electrically connected to the bridge rectifier.

* * * * *